(12) United States Patent
Takada

(10) Patent No.: US 9,837,960 B2
(45) Date of Patent: Dec. 5, 2017

(54) OSCILLATION CIRCUIT

(71) Applicant: SII Semiconductor Corporation, Chiba-shi, Chiba (JP)

(72) Inventor: Kosuke Takada, Chiba (JP)

(73) Assignee: SII SEMICONDUCTOR CORPORATION, Chiba (JP)

( * ) Notice: Subject to any disclaimer, the term of this patent is extended or adjusted under 35 U.S.C. 154(b) by 0 days.

(21) Appl. No.: 15/272,695

(22) Filed: Sep. 22, 2016

(65) Prior Publication Data

US 2017/0093334 A1    Mar. 30, 2017

(30) Foreign Application Priority Data

Sep. 30, 2015  (JP) ................................. 2015-194570

(51) Int. Cl.
| | |
|---|---|
| *H03L 7/00* | (2006.01) |
| *H03B 5/12* | (2006.01) |
| *H02M 3/07* | (2006.01) |
| *H03K 3/0231* | (2006.01) |

(52) U.S. Cl.
CPC ............ *H03B 5/1234* (2013.01); *H02M 3/07* (2013.01); *H03B 5/1271* (2013.01); *H03K 3/0231* (2013.01); *H03L 7/00* (2013.01)

(58) Field of Classification Search
CPC .... H03L 7/00; H03K 3/0231; H03B 5/12721; H03B 5/1234; H02M 3/07

USPC ................................. 331/16, 57, 34; 327/156
See application file for complete search history.

(56) References Cited

U.S. PATENT DOCUMENTS

2013/0015894 A1*  1/2013  Kouyama ............. H03L 7/0995
                                                          327/156

FOREIGN PATENT DOCUMENTS

JP           2001-044808 A      2/2001

* cited by examiner

*Primary Examiner* — Arnold Kinkead
(74) *Attorney, Agent, or Firm* — Brinks Gilson & Lione

(57) ABSTRACT

Provided is an oscillation circuit that can limit a maximum value and a minimum value of a frequency even when some troubles are caused in a V/I conversion circuit. The oscillation circuit includes a current controlled oscillator configured to oscillate based on an input current, and a current limiting circuit configured to: compare the input current with a first constant current and with a second constant current; limit, when the input current reaches the first constant current, a maximum current value of the input current with a transistor arranged on a path of the input current; and limit, when the input current is lowered to the second constant current, a minimum current of the input current through addition of current on the path of the input current by a transistor arranged in parallel with the path of the input current.

7 Claims, 5 Drawing Sheets

OSCILLATION CIRCUIT

RELATED APPLICATIONS

This application claims priority under 35 U.S.C. §119 to Japanese Patent Application No. 2015-194570 filed on Sep. 30, 2015, the entire content of which is hereby incorporated by reference.

BACKGROUND OF THE INVENTION

1. Field of the Invention

The present invention relates to an oscillation circuit, and more particularly, to a technology accommodating an abnormal control current of an oscillation circuit in which an oscillation frequency is controlled by current.

2. Description of the Related Art

FIG. 4 is a circuit diagram of a related-art oscillation circuit 400.

The related-art oscillation circuit 400 includes a power supply terminal 101, a ground terminal 102, a V/I conversion circuit 103, PMOS transistors 115 and 118, and a current controlled oscillator 104.

The V/I conversion circuit 103 includes a first reference voltage source 111, an error amplifier 112, an NMOS transistor 114, and a resistor 113.

FIG. 5 is a circuit diagram of the current controlled oscillator 104.

The current controlled oscillator 104 includes a capacitor 141, a second reference voltage source 143, a comparator 142, and an NMOS transistor 144.

Connection in the related-art oscillation circuit 400 is described with reference to FIG. 4 and FIG. 5. A non-inverting input terminal of the error amplifier 112 is connected to one end of the first reference voltage source 111. Another end of the first reference voltage source 111 is connected to the ground terminal 102. A gate of the NMOS transistor 114 is connected to an output of the error amplifier 112, and a source thereof is connected to an inverting input terminal of the error amplifier 112 and one end of the resistor 113. Another end of the resistor 113 is connected to the ground terminal 102. A source of the PMOS transistor 115 is connected to the power supply terminal 101, and a gate and a drain thereof are connected to a drain of the NMOS transistor 114. A source of the PMOS transistor 118 is connected to the power supply terminal 101, a gate of the PMOS transistor 118 is connected to the gate of the PMOS transistor 115, and a drain of the PMOS transistor 118 is connected to one end of the capacitor 141, a drain of the NMOS transistor 144, and a non-inverting input terminal of the comparator 142 that are all located in the current controlled oscillator 104. An inverting input terminal of the comparator 142 is connected to one end of the second reference voltage source 143. Another end of the second reference voltage source 143 is connected to the ground terminal 102. A gate of the NMOS transistor 144 is connected to an output of the comparator 142, and a source thereof is connected to the ground terminal 102. Another end of the capacitor 141 is connected to the ground terminal 102.

Operation of the related-art oscillation circuit 400 is now described.

The V/I conversion circuit 103 operates so that a voltage VREF of the first reference voltage source 111 and a source voltage of the NMOS transistor 114 are equal to each other with a negative feedback loop including the error amplifier 112. As a result, a voltage that is equal to the voltage VREF is applied to the resistor 113, and a drain current I1 of the NMOS transistor 114 is a constant current. The PMOS transistors 115 and 118 form a current mirror circuit, and a current I2 directly proportional to the current I1 is supplied to the current controlled oscillator 104.

FIG. 6 is a waveform diagram for showing operation of the current controlled oscillator 104. In the current controlled oscillator 104, the current I2 is a current for charging the capacitor 141, and a slope-like voltage VRAMP is generated at the one end of the capacitor 141. When the voltage VRAMP reaches a voltage VPK of the second reference voltage source 143, an output CMPOUT of the comparator 142 becomes high, the NMOS transistor 144 is turned on, and the capacitor 141 is discharged. The comparator 142 has a detection delay, and thus, the output CMPOUT becomes low with a certain delay time, the NMOS transistor 144 is turned off, and again, the capacitor 141 is charged. Through repetition of the operation described above, the voltage VRAMP has a sawtooth waveform having predetermined amplitude and a predetermined frequency, and the oscillation operation continues.

In Japanese Patent Application Laid-open No. 2001-44808, there is disclosed that, in such a related-art oscillation circuit, the error amplifier 112 is configured such that an upper limit value and a lower limit value of the oscillation frequency can be controlled to be desired values.

However, in the oscillation circuit disclosed in Japanese Patent Application Laid-open No. 2001-44808, through change of the voltage VREF of the reference voltage source 111, a current flowing through the NMOS transistor 114 is changed to control the upper limit value and the lower limit value of the oscillation frequency, and thus, when some troubles are caused in the V/I conversion circuit 103 itself, the current flowing through the NMOS transistor 114 cannot be controlled, and a frequency outside a desired range may be output.

For example, when the resistor 113 is short-circuited and fails, excessive current flows through the NMOS transistor 114 and the frequency exceeds the desired range. Further, on the other hand, when the resistor 113 is open-circuited and fails, the current flowing through the NMOS transistor 114 becomes 0 A and the oscillation operation is stopped.

SUMMARY OF THE INVENTION

The present invention has been made to solve the problems described above, and provides an oscillation circuit that can limit a maximum value and a minimum value of the frequency even when some troubles are caused in a V/I conversion circuit 103.

In order to solve the related-art problems, according to one embodiment of the present invention, there is provided an oscillation circuit, including: a current source circuit configured to generate a second current based on a first current flowing through a first current path between a power supply terminal and a current input terminal; and a current controlled oscillator configured to oscillate based on the second current, the current source circuit including: a first PMOS transistor arranged on the first current path, and including a gate and a drain connected to each other; a second PMOS transistor forming a current mirror circuit with the first PMOS transistor, the second PMOS transistor being configured to cause the second current to flow therethrough; a third PMOS transistor forming a current mirror circuit with the first PMOS transistor; a constant current source connected to a drain of the third PMOS transistor; and a fourth PMOS transistor configured to limit a current value of the first current, and including a gate being controlled by a voltage of the drain of the third PMOS transistor.

According to the oscillation circuit of the present invention, even when a current that is input to the current input terminal becomes excessively larger, or stops, the fourth PMOS transistor can limit a maximum value or a minimum value of the first current depending on a magnitude relationship between a current value of the constant current source and the first current.

DETAILED DESCRIPTION OF THE PREFERRED EMBODIMENTS

Figure 1:
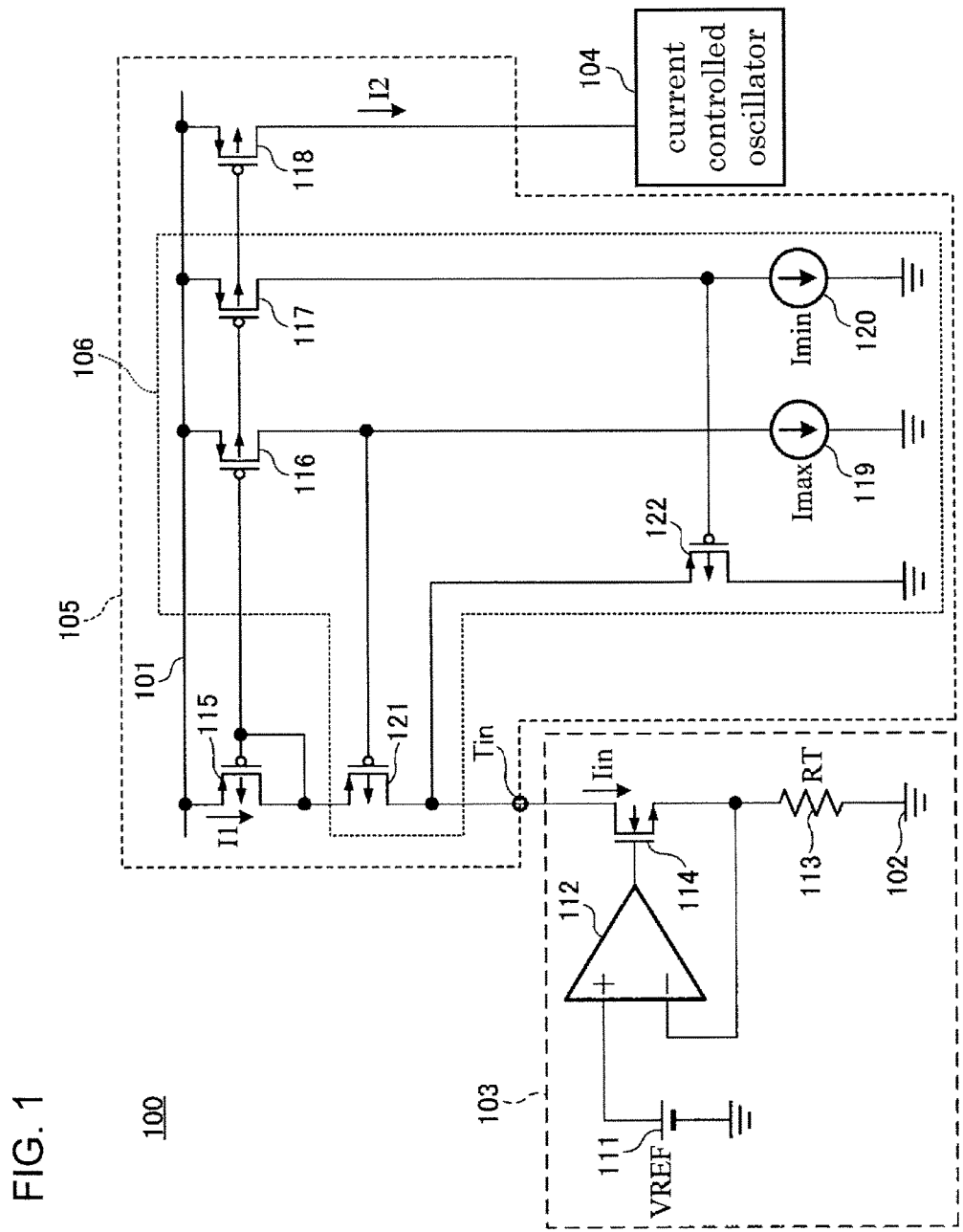
FIG. 1 is a circuit diagram of an oscillation circuit according to a first embodiment of the present invention.

FIG. 1 is a circuit diagram of an oscillation circuit 100 according to a first embodiment of the present invention.

The oscillation circuit 100 according to this embodiment includes a V/I conversion circuit 103, a current controlled oscillator 104, and a current source circuit 105.

Figure 4:
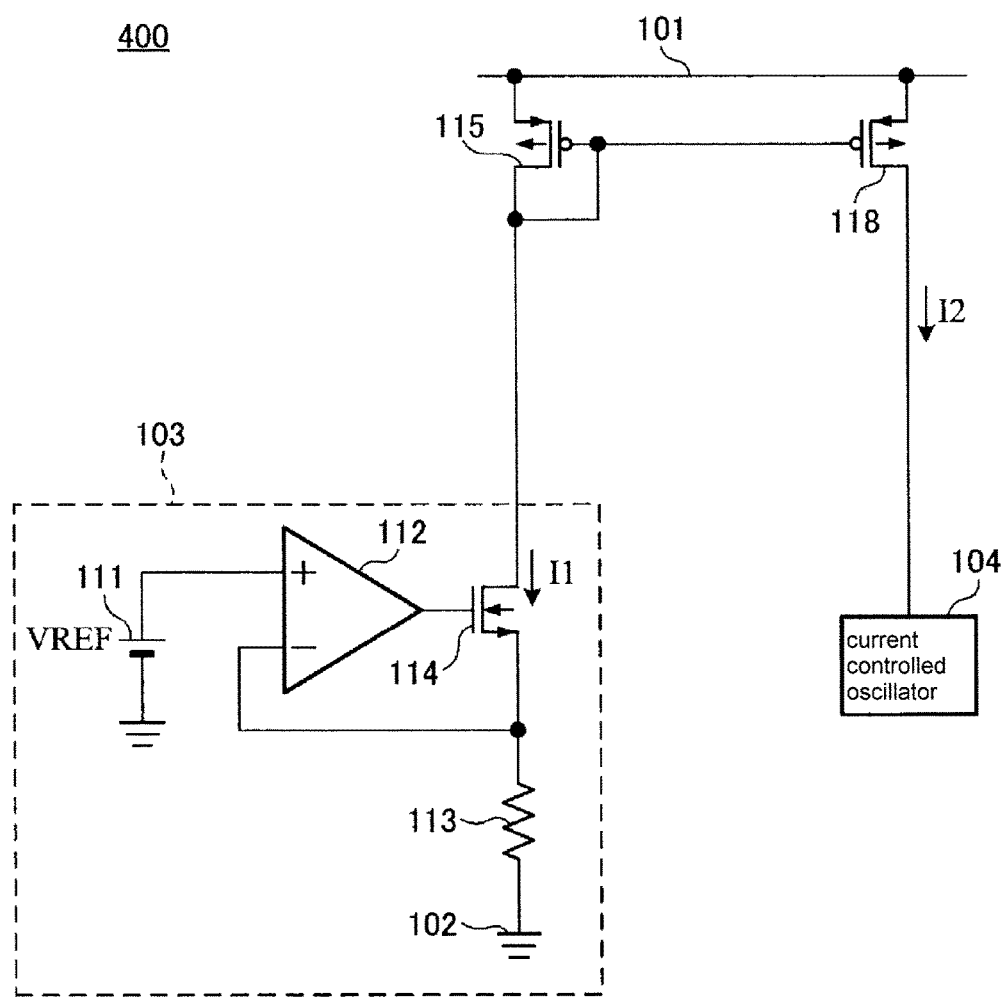
FIG. 4 is a circuit diagram of the related-art oscillation circuit.
Figure 5:
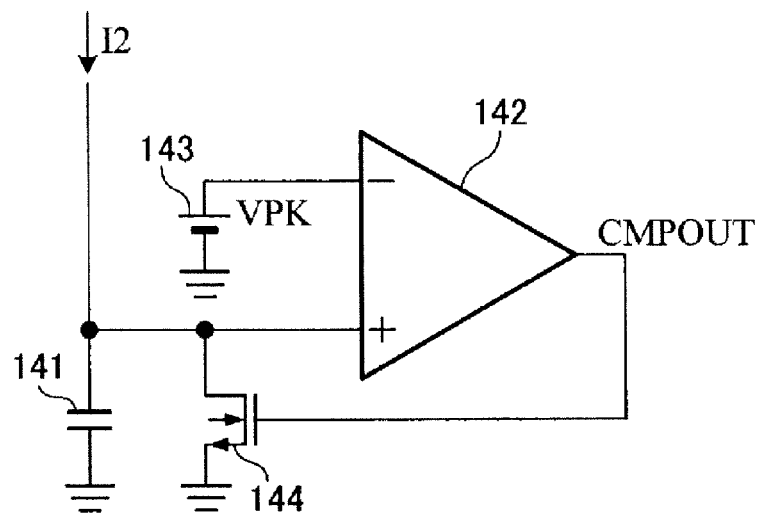
FIG. 5 is a circuit diagram for illustrating an exemplary current controlled oscillator.
Figure 6:
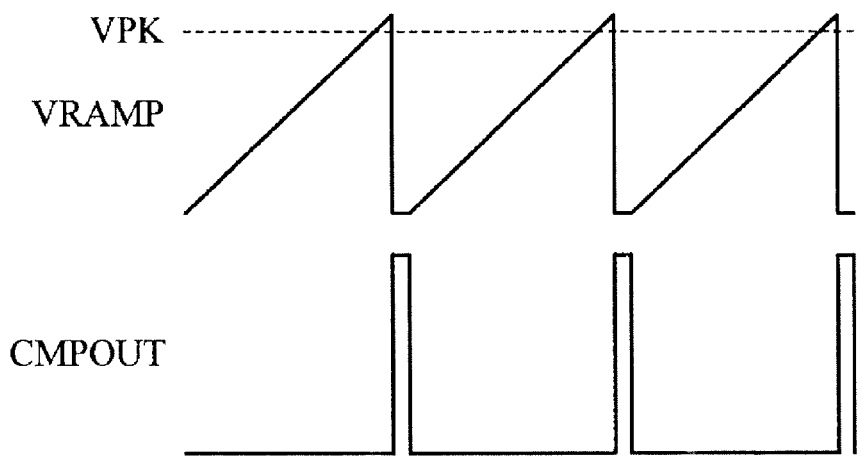
FIG. 6 is a waveform diagram for showing operation of the current controlled oscillator.

Circuit configurations of the V/I conversion circuit 103 and the current controlled oscillator 104 are similar to those of the V/I conversion circuit 103 of the related-art oscillation circuit 400 illustrated in FIG. 4 and the current controlled oscillator 104 illustrated in FIG. 5, respectively. Thus, like structural elements are denoted by like reference symbols and redundant description is omitted as appropriate.

A current flowing through an NMOS transistor 114 of the V/I conversion circuit 103 is represented by an input current Iin in FIG. 1 as a current that is input to a current input terminal Tin of the current source circuit 105.

The current source circuit 105 includes, in addition to the current mirror circuit including the PMOS transistors 115 and 118 in the related-art oscillation circuit 400, a current limiting circuit 106 configured to limit a maximum current value and a minimum current value of a current I1 flowing through a PMOS transistor 115.

The current limiting circuit 106 includes PMOS transistors 116, 117, 121, and 122 and constant current sources 119 and 120. The constant current sources 119 and 120 have current values of Imax and Imin, respectively.

Connection in the current source circuit 105 is now described.

A source of the PMOS transistor 115 is connected to a power supply terminal 101, and a gate and a drain thereof are connected to each other. A source of the PMOS transistor 116 is connected to the power supply terminal 101, and a drain thereof is connected to one end of the current source 119 and a gate of the PMOS transistor 121. A source of the PMOS transistor 117 is connected to the power supply terminal 101, and a drain thereof is connected to one end of the current source 120 and a gate of the PMOS transistor 122. A source of the PMOS transistor 118 is connected to the power supply terminal 101, and a drain thereof is connected to the current controlled oscillator 104.

Gates of the PMOS transistors 115, 116, 117, and 118 are connected in common. The PMOS transistors 115 and 116, the PMOS transistors 115 and 117, and the PMOS transistors 115 and 118 form current mirror circuits, respectively. Here, for the sake of simple description to be made below, it is assumed that each of the current mirror circuits has a mirror ratio of 1:1.

A source of the PMOS transistor 121 is connected to a drain of the PMOS transistor 115. A source of the PMOS transistor 122 is connected to a drain of the NMOS transistor 114 and a drain of the PMOS transistor 121, and a drain of the PMOS transistor 122 is connected to a ground terminal 102. Another end of the current source 119 is connected to the ground terminal 102. Another end of the current source 120 is connected to the ground terminal 102.

Next, operation of the oscillation circuit 100 according to this embodiment is described.

Figure 2:
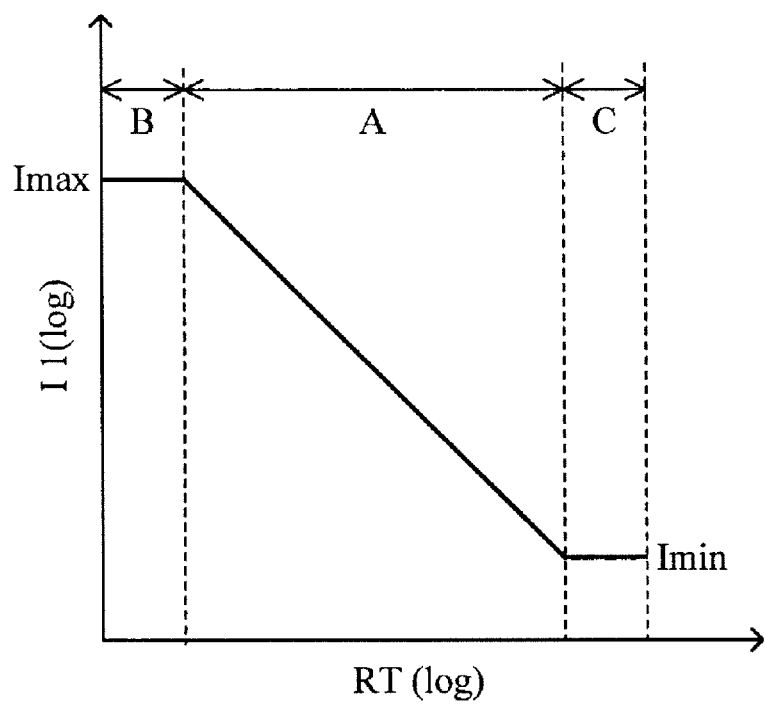
FIG. 2 is an explanatory graph for showing operation of the oscillation circuit according to the first embodiment of the present invention.

FIG. 2 is an explanatory graph for showing the operation of the oscillation circuit according to this embodiment.

In FIG. 2, the horizontal axis denotes a resistance value RT of the resistor 113, and the vertical axis denotes the current I1 flowing through the PMOS transistor 115.

First, a region A in FIG. 2 is described. In this region, the current limiting circuit 106 does not operate, and the current Iin generated in the V/I conversion circuit 103 is output via the drain of the NMOS transistor 114 and is input to the current source circuit 105 as an input current. At this time, the input current Iin and the current I1 of the PMOS transistor 115 have the same current value. As described above, the PMOS transistors 115 and 118 form a current mirror circuit, and thus, a current I2 directly proportional to the current I1 is supplied to the current controlled oscillator 104 (in this embodiment, the current I2 has the same current value as the current I1 because the mirror ratio is 1:1). Consequently, the current controlled oscillator 104 oscillates at a predetermined frequency.

The PMOS transistors 115 and 116 form a current mirror circuit, and thus, a current having the same current value as the current I1 is supplied to the current source 119. In the region A, a drain current of the PMOS transistor 116 is smaller than a current of the current source 119, and a gate voltage of the PMOS transistor 121 is almost 0 V. Thus, the PMOS transistor 121 is on. The PMOS transistors 115 and 117 form a current mirror circuit, and thus, a current having the same current value as the current I1 is supplied to the current source 120. In the region A, a drain current of the PMOS transistor 117 is larger than a current of the current source 120, and a gate voltage of the PMOS transistor 122 is approximately equal to a voltage of the power supply terminal 101. Thus, the PMOS transistor 122 is off.

Next, a region B in FIG. 2 is described. As the resistance value RT of the resistor 113 reduces, the current Iin and the current I1 increase. With this, current of the PMOS transistor 116 configured to mirror the current I1 increases. When the current of the PMOS transistor 116 becomes larger than the current Imax of the current source 119, the gate voltage of the PMOS transistor 121 increases, and the current I1 is limited to the current Imax of the current source 119. As a result, a maximum current of the current I2 of the PMOS transistor 118 configured to mirror the current I1 is limited to limit a maximum frequency of the current controlled oscillator 104. The PMOS transistor 122 is off as in the region A.

Finally, a region C in FIG. 2 is described. As the resistance value RT increases, the current Iin and the current I1 reduce.

With this, the current of the PMOS transistor 117 configured to mirror the current I1 reduces. When the current of the PMOS transistor 117 becomes smaller than the current Imin of the current source 120, the gate voltage of the PMOS transistor 122 reduces and a drain current thereof increases. The drain current of the PMOS transistor 122 increases so as to compensate for the reduction in the current Iin, and, as a result, the minimum current of the current I1 is limited to the current Imin of the current source 120. As a result, the minimum current of the current I2 of the PMOS transistor 118 configured to mirror the current I1 is limited to limit a minimum frequency of the current controlled oscillator 104. The PMOS transistor 121 is on as in the region A.

In the description of the operation above, change in the resistor 113 is described. When another element in the V/I conversion circuit 103 fails, the currents I1 and I2 are similarly limited.

As described above, in the oscillation circuit according to this embodiment, even when some troubles are caused in the V/I conversion circuit, the current supplied to the current controlled oscillator 104 can be limited to limit the maximum value and the minimum value of the frequency.

Figure 3:
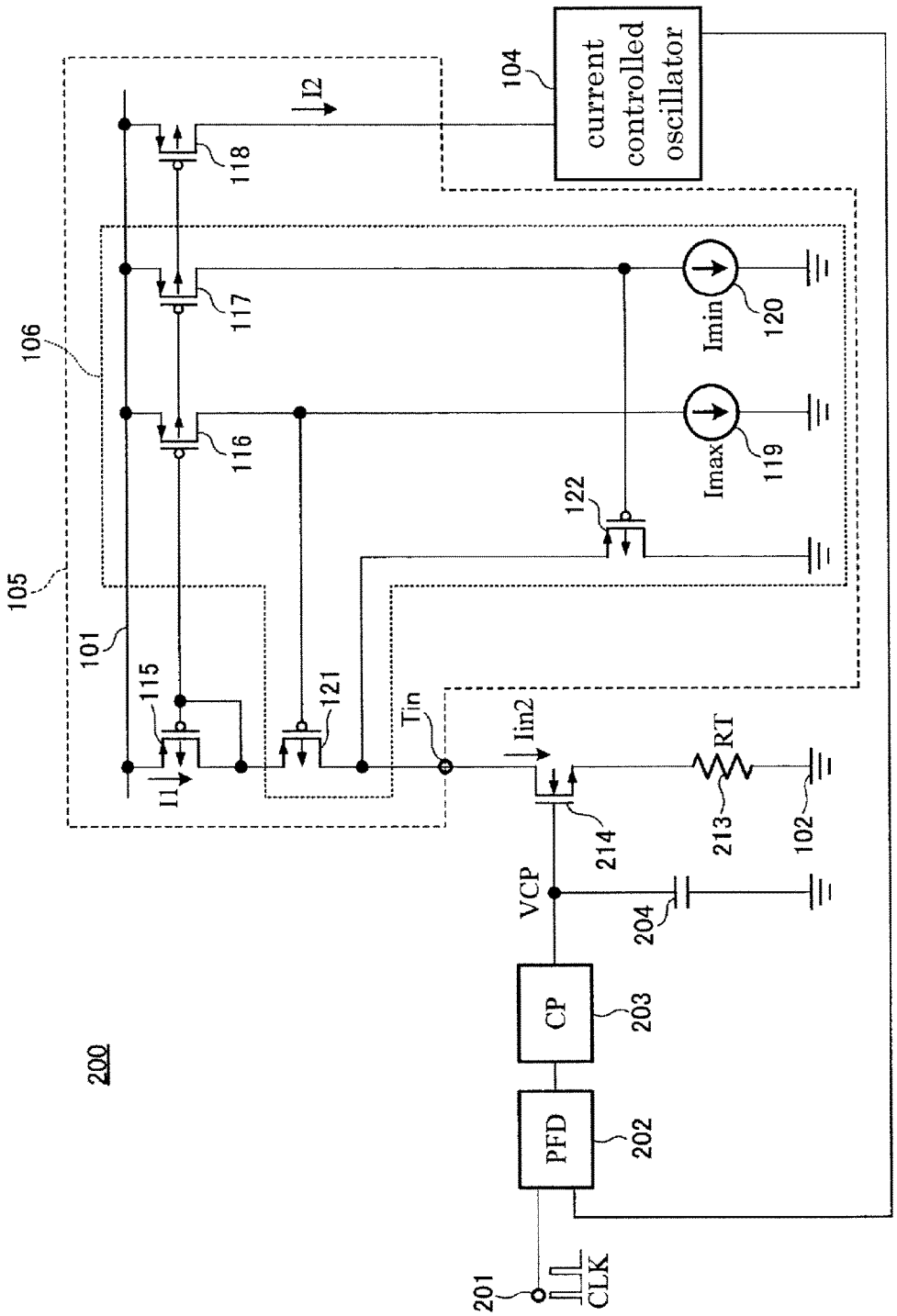
FIG. 3 is a circuit diagram of an oscillation circuit according to a second embodiment of the present invention.

FIG. 3 is a circuit diagram of an oscillation circuit 200 according to a second embodiment of the present invention.

The oscillation circuit 200 according to this embodiment includes, instead of the V/I conversion circuit 103 of the oscillation circuit 100 according to the first embodiment, a clock input terminal 201, a phase/frequency comparator circuit (PFD) 202, a charge pump circuit (CP) 203, a capacitor 204, an NMOS transistor 214, and a resistor 213.

A current controlled oscillator 104 and a current source circuit 105 are similar to those in the oscillation circuit 100 illustrated in FIG. 1, and thus, like structural elements are denoted by like reference symbols and redundant description is omitted.

A clock signal CLK that is input from the clock input terminal 201 and output of the current controlled oscillator 104 are input to the phase/frequency comparator circuit 202. Output of the phase/frequency comparator circuit 202 is input to the charge pump circuit 203, and an output of the charge pump circuit 203 is connected to one end of the capacitor 204 and a gate of the NMOS transistor 214. Another end of the capacitor 204 is connected to the ground terminal 102. A drain of the NMOS transistor 214 is connected to the input terminal Tin of the current source circuit 105, and a source thereof is connected to the ground terminal 102 via the resistor 213.

The oscillation circuit 200 includes, instead of the V/I conversion circuit 103 in the oscillation circuit 100, the structural elements described above, and forms a PLL circuit. An input current Iin2 obtained through V/I conversion of a voltage VCP of the capacitor 204 by the NMOS transistor 214 and the resistor 213 is input to the input terminal Tin of the current source circuit 105.

Similarly to the case of the oscillation circuit 100 illustrated in FIG. 1, the current I2 directly proportional to the current I1 flowing through the PMOS transistor 115 is supplied to the current controlled oscillator 104 by virtue of the input current Iin2, and a desired frequency is obtained. In this case, when a signal having a frequency above a desired range is input to the clock input terminal, the PLL circuit operates to increase the voltage VCP of the capacitor 204, thereby increasing the current Iin2 of the NMOS transistor 214, and thus, the current I1 and the current I2 increase. When the current I1 reaches an upper limit value, the current limiting circuit 106 operates such that the current I1 is limited to the current Imax of the current source 119 similarly to the case of the oscillation circuit 100 illustrated in FIG. 1. The minimum value can also be limited similarly, although detailed description thereof is omitted. In this way, a PLL circuit configuration can also limit the current supplied to the current controlled oscillator 104 to limit the maximum value and the minimum value of the frequency.

The embodiments of the present invention have been described above, but needless to say that the present invention is not limited to the above-mentioned embodiments, and that various modifications can be made thereto without departing from the gist of the present invention.

For example, in the embodiments described above, cases in which the current controlled oscillator 104 is used as an oscillator are described, but other oscillators, such as a ring oscillator, may also be used.

Further, in the embodiments described above, the current limiting circuit 106 configured to limit both the maximum value and the minimum value is described, but only any one of a configuration in which the maximum value is limited and a configuration in which the minimum value is limited may be adopted.

Further, the PMOS transistor 121 may be arranged anywhere on a path from the input terminal Tin (the drain of the NMOS transistor 114 or 214) to the power supply terminal 101, and the position thereof is not limited to the positions illustrated in FIG. 1 and FIG. 3.

Further, the drain of the PMOS transistor 122 may be connected to anywhere on a path from the input terminal Tin to the drain of the PMOS transistor 115, and the position thereof is not limited to the positions illustrated in FIG. 1 and FIG. 3.

What is claimed is:

1. An oscillation circuit, comprising:
   a current source circuit configured to generate a second current based on a first current flowing through a first current path between a power supply terminal and a current input terminal; and
   a current controlled oscillator configured to oscillate based on the second current, the current source circuit comprising:
   a first PMOS transistor in the first current path, and including a gate and a drain connected to each other;
   a second PMOS transistor forming a current mirror circuit with the first PMOS transistor, the second PMOS transistor configured to cause the second current to flow therethrough;
   a third PMOS transistor forming a current mirror circuit with the first PMOS transistor;
   a constant current source connected to a drain of the third PMOS transistor; and
   a fourth PMOS transistor configured to limit a current value of the first current, and including a gate controlled by a voltage of the drain of the third PMOS transistor.

2. An oscillation circuit according to claim 1, wherein the fourth PMOS transistor is connected to the power supply terminal and to the current input terminal in the first current path and is configured to limit a maximum current value of the first current.

3. An oscillation circuit according to claim 1, wherein the fourth PMOS transistor is in second current path between the current input terminal and a ground terminal and is connected to the current input terminal and the ground terminal and is configured to limit a minimum current value of the first current.

4. An oscillation circuit according to claim 2, further comprising:

a fifth PMOS transistor forming a current mirror circuit with the first PMOS transistor;
a constant current source connected to a drain of the fifth PMOS transistor; and
a sixth transistor in a second current path between the current input terminal and a ground terminal,
wherein the sixth transistor is configured to limit a minimum current value of the first current.

5. An oscillation circuit according to claim 1, further comprising a V/I conversion circuit configured to output a predetermined current based on a predetermined voltage,
wherein an output of the V/I conversion circuit is connected to the current input terminal.

6. An oscillation circuit according to claim 1, further comprising:
a phase/frequency comparator circuit configured to receive a clock signal and output of the current controlled oscillator;
a charge pump circuit configured to receive output of the phase/frequency comparator circuit;
a capacitor connected to an output of the charge pump circuit;
an NMOS transistor including a drain connected to the current input terminal, and a gate configured to receive an output of the charge pump circuit; and
a resistor connected to a source of the NMOS transistor.

7. An oscillation circuit, comprising:
a current controlled oscillator configured to oscillate based on an input current; and
a current limiting circuit including a maximum current source, a minimum current source, an input terminal and a ground terminal, and configured to:
compare the input current with a first constant current and with a second constant current;
when the input current reaches the first constant current, limit a maximum current value of the input current with a transistor having a gate connected to the maximum current source in a path of the input current between the input terminal and the ground terminal; and
when the input current is lowered to the second constant current, limit a minimum current of the input current through addition of current on the path of the input current by a transistor having a gate connected to the minimum current source and in parallel with the path of the input current.

* * * * *